United States Patent
Sun et al.

(10) Patent No.: US 11,323,039 B2
(45) Date of Patent: May 3, 2022

(54) METHOD FOR IMPROVING CONVERSION EFFICIENCY OF CCM MODE OF FLYBACK RESONANT SWITCH POWER SUPPLY

(71) Applicants: CSMC TECHNOLOGIES FAB2 CO., LTD., Jiangsu (CN); SOUTHEAST UNIVERSITY, Jiangsu (CN)

(72) Inventors: Weifeng Sun, Wuxi New District (CN); Rongrong Tao, Wuxi New District (CN); Hao Wang, Wuxi New District (CN); Jinyu Xiao, Wuxi New District (CN); Wei Su, Wuxi New District (CN); Shen Xu, Wuxi New District (CN); Longxing Shi, Wuxi New District (CN)

(73) Assignees: CSMC TECHNOLOGIES FAB2 CO., LTD.; SOUTHEAST UNIVERSITY

( * ) Notice: Subject to any disclaimer, the term of this patent is extended or adjusted under 35 U.S.C. 154(b) by 58 days.

(21) Appl. No.: 16/959,001

(22) PCT Filed: Dec. 29, 2018

(86) PCT No.: PCT/CN2018/125730
§ 371 (c)(1),
(2) Date: Jun. 29, 2020

(87) PCT Pub. No.: WO2019/129291
PCT Pub. Date: Jul. 4, 2019

(65) Prior Publication Data
US 2020/0336070 A1 Oct. 22, 2020

(30) Foreign Application Priority Data
Dec. 29, 2017 (CN) .......................... 201711474027.4

(51) Int. Cl.
*H02M 3/335* (2006.01)
*H03K 5/24* (2006.01)
*H02M 1/00* (2006.01)

(52) U.S. Cl.
CPC .......... *H02M 3/33576* (2013.01); *H03K 5/24* (2013.01); *H02M 1/0009* (2021.05);
(Continued)

(58) Field of Classification Search
CPC ......... H02M 3/33507; H02M 3/33515; H02M 3/33523; H02M 3/33576; H02M 3/33592
See application file for complete search history.

(56) References Cited

U.S. PATENT DOCUMENTS 8,363,430 B2 * 1/2013 Ye ..................... H02M 3/33507
363/21.16
9,007,786 B2 * 4/2015 Yang ................. H02M 3/33507
363/21.15
(Continued)

FOREIGN PATENT DOCUMENTS

CN 102638169 A 8/2012
CN 103795254 A 5/2014
(Continued)

OTHER PUBLICATIONS

International Search Report dated Mar. 27, 2019 in the parent application PCT/CN2018/125730 (2 pages).

*Primary Examiner* — Gary A Nash
(74) *Attorney, Agent, or Firm* — Polsinelli PC

(57) ABSTRACT

A method for improving the conversion efficiency of a CCM mode of a flyback resonant switch power supply, comprising: presetting a critical value Tset, calculating a time interval Ttap between adjacent zero points in the current connection time, outputting a shutdown signal at the zero points, and comparing the time interval Ttap with the preset critical value Tset; when Ttap>Tset, controlling the current (Continued)

shutdown time to be less than the shutdown time of the preceding cycle and outputting a start signal; when Ttap=0, controlling the current shutdown time to be greater than the shutdown time of the preceding cycle and outputting a start signal; and when 0<Ttap<=Tset, controlling the current shutdown time to be the same as the shutdown time of the preceding switch cycle and outputting a start signal.

20 Claims, 9 Drawing Sheets

(52) U.S. Cl.
CPC ........ *H02M 1/0025* (2021.05); *H02M 1/0058* (2021.05); *H02M 3/33515* (2013.01); *H02M 3/33523* (2013.01); *H02M 3/33592* (2013.01)

(56) References Cited

U.S. PATENT DOCUMENTS

| | | | |
|---|---|---|---|
| 9,350,249 B2 | 5/2016 | Valley | |
| 2007/0217232 A1* | 9/2007 | Djenguerian | H02M 3/33515 363/21.01 |
| 2008/0061746 A1* | 3/2008 | Kobayashi | H02M 3/33507 320/166 |
| 2013/0301309 A1* | 11/2013 | Chen | H02M 3/33523 363/21.12 |
| 2014/0016366 A1* | 1/2014 | Su | H02M 3/33507 363/21.12 |
| 2014/0092648 A1* | 4/2014 | Tang | H02M 3/33515 363/21.17 |
| 2014/0301116 A1* | 10/2014 | Zhang | H02M 3/33507 363/21.15 |
| 2015/0016157 A1* | 1/2015 | Wei | H02M 3/33507 363/50 |
| 2016/0126848 A1* | 5/2016 | Sasaki | H02M 1/32 349/69 |
| 2016/0276936 A1* | 9/2016 | Gritti | H02M 1/4258 |
| 2016/0373011 A1* | 12/2016 | Kawashima | H02M 3/33507 |

FOREIGN PATENT DOCUMENTS

| | | |
|---|---|---|
| CN | 105978344 A | 9/2016 |
| CN | 107154723 A | 9/2017 |
| CN | 206807287 U | 12/2017 |

* cited by examiner

METHOD FOR IMPROVING CONVERSION EFFICIENCY OF CCM MODE OF FLYBACK RESONANT SWITCH POWER SUPPLY

CROSS-REFERENCE TO RELATED APPLICATIONS

This application is a National Phase of International Application No. PCT/CN2018/125730, filed on Dec. 29, 2018, which claims priority to Chinese Patent Application No. 201711474027.4, entitled "METHOD FOR IMPROVING CONVERSION EFFICIENCY OF CCM MODE OF FLYBACK RESONANT SWITCH POWER SUPPLY" filed on Dec. 29, 2017, the contents of which are expressly incorporated by reference herein in their entireties.

TECHNICAL FIELD

The disclosure relates to the field of switching power supplies, and in particular to a method for improving the Continuous Conduction Mode (CCM) conversion efficiency of a flyback resonant switching power supply, and a method and a control system for controlling a resonant switching power supply.

BACKGROUND

Switching power supplies have been developing toward miniaturization, high frequency, modularity, and lightweight. With the increasing frequency of switching power supply operation, switching losses due to increased switching frequency are becoming a serious problem. Therefore, in the design of switching power supplies, switching losses need to be carefully analyzed and dealt with.

In a resonant soft switching circuit, ideally the switching device can be switched on and off at zero voltage or zero current with zero switching loss. In the quasi-resonant switching power supply circuit, how to accurately realize the Zero Current Switching (ZCS) or quasi-Zero Voltage Switching (ZVS) of the switching device to maximize the reduction of switching losses, is the difficulty of design.

SUMMARY

To address the restrictions and disadvantages in the conventional technologies, the present disclosure proposes a method for improving CCM conversion efficiency of a flyback resonant switching power supply, a control method for a resonant switching power supply, and a control system for a resonant switching power, to accurately realize a primary MOS transistor ZCS and quasi-ZVS, minimize the switching loss of the primary MOS transistor and achieving an improvement to the efficiency of the pow supply.

A method for improving CCM conversion efficiency of a flyback resonant switching power supply is on the basis of a control system of a soft-switch flyback resonant circuit. The control system including a current detection module, a state detection module, a PWM module, an output feedback module, and a drive module is connected to a controlled switching power supply to form a closed loop. The control system controls the switching power supply in a soft-start state or a ON-OFF state and based on a ON-OFF control method, in which:

the current detection module is configured to collect basic parameters for implementing a constant voltage algorithm, the current detection module includes a comparator COMP1 and a D flip-flop D1, a positive end of the comparator COMP1 is connected to an primary sampling resistance voltage Vs, a negative end is grounded, the comparator COMP1 outputs a signal VCOMP1 to a D input end of the D flip-flop D1, and a clock end of the D flip-flop D1 is connected to the clock signal CLK as a working clock of the system, an output end Q of the D flip-flop D1 outputs a signal VCOMP1', both comparison signals VCOMP1 and VCOMP1' are outputted to the state detection module and the PWM module;

the state detection module is configured to determine whether an operation state of the control system is a soft-start state or an ON-OFF state, the state detection module includes a counter Counter1 and a D flip-flop D2, input signals of the state detection module are the comparison signals VCOMP1 and VCOMP1' outputted by the current detection module and a switch control signal Duty outputted by the driving module, output signals of the state detection module are operation state signals State outputted to the output feedback module, the PWM module, and the driving module; defining State=0 as the soft-start state and State=1 as the ON-OFF state; an input end D of the D flip-flop D2 is connected to the switch control signal Duty outputted by the driving module, the clock signal CLK is inputted to the clock end of the D flip-flop D2 as a working clock CK of the system, an output end Q of the D flip-flop D2 outputting comparison signals VCOMP1, VCOMP1', the comparison signals VCOMP1, VCOMP1' and the switch control signal Duty outputted by the driving module and the output signal Duty' of the D flip-flop D2 are input signals of the counter Counter1 and the counter Counter1 outputs the operation state signal State;

the output feedback module is configured to control a ripple size of an output voltage Vo of the switching power supply in the ON-OFF state; input signals of the output feedback module is a secondary output voltage Vo and the operation state signal State outputted by the state detection module, the output feedback module includes two comparators COMP2 and COMP3 and a SR latch Latch1; the comparator COMP2 compares the output voltage Vo with an output voltage upper limit Vmax and outputting VCOMP2 to a R end of the SR latch Latch1, the comparator COMP3 compares the output voltage Vo with an output voltage lower limit Vmin and outputting VCOMP3 to a S end of the SR latch Latch1, a positive end of the comparator COMP2 is connected to the Vo, a negative end is connected to the output voltage upper limit Vmax, the output is VCOMP2, a positive end of the comparator COMP3 is connected to the output voltage lower limit Vmin, the negative end is connected to Vo, the output is VCOMP3, an output signal and a state control signal outputted by a Q end of the SR latch Latch1 are two input signals of an AND gate And1, and an output of the AND gate is an ON-OFF enabling signal Enable_ON-OFF to be outputted to the drive module and the PWM module;

the PWM module is configured to control a conducting time and switch-off time of a MOS transistor of the switching power supply, to realize a zero current ZCS switch-off and a quasi-zero voltage ZVS switch-on of the original MOS transistor, and to minimize a switching loss of the original MOS transistor; input signals of the PWM module are an ON-OFF enabling signal Enable_ON-OFF outputted by the output feedback module, the operation state signal State outputted by the state detection module, the comparison signals VCOMP1 and VCOMP1' outputted by the current detection module and the switch control signal Duty outputted by the drive module, the output signals of the PWM module are a MOS transistor switch-off signal Flag_off and a MOS transistor switch-on signal Flag_on inputted to the drive module, so that the switch control signal Duty can be modulated based on the two different operation states of the soft-start and the ON-OFF; and inputs of the driving module are the MOS transistor switch-off signal Flag_off and the MOS transistor switch-on signal Flag_on outputted by the PWM module, the operation state signal State outputted by the state detecting module, and the ON-OFF switch-on signal Enable_ON-OFF outputted by the output feedback module, the driving module outputs a modulated corresponding duty ratio switch control signal Duty to control a switch-on and a switch-off of a power transistor of the switching power supply and realize an improvement to an efficiency of the switching power supply.

A control method for a resonant switching power supply, including:

sampling: sampling and processing a primary resistance voltage of the switching power supply to generate a first signal;

state detection: acquiring the first signal and a switch control signal and determining an operation state of the switching power supply, the operation state being a soft-start state or a ON-OFF state;

switch control: presetting a threshold value Tset, when the operation state is the ON-OFF state, performing:

a first switch-off control: acquiring the first signal and the switch control signal, calculating a time interval Ttap between zero points of adjacent primary currents of the switching power supply during a present conducting time, and outputting a first control signal at the zero points and the first control signal being a switch-off signal;

a first switch-on control: comparing the time interval Ttap with the preset threshold value Tset, when Ttap>Tset, controlling the present switch-off time to be less than a switch-off time of a previous cycle, outputting the first control signal and the first control signal being a switch-on signal, when Ttap=0, controlling the present switch-off time to be greater than a switch-off time of the previous cycle, outputting the first control signal and the first control signal being the switch-on signal, when 0<Ttap<=Tset, controlling the present switch-off time to be the same as the switch-off time of the previous switch cycle, outputting the first control signal and the first control signal being a switch-on signal; and drive output: generating the switch control signal according to the first control signal, when the first control signal is a switch-on signal, the switch control signal is a switch-on signal, and when the first control signal is a switch-off signal, the switch control signal is a switch-off signal.

A control system for a resonant switching power, including:

a current detection module configured to sample a primary sampling resistance voltage of the switching power supply and processing the primary sampling resistance voltage to output a first signal;

a state detection module connected to the current detection module to acquire the first signal, connected to a driving module to acquire a switch control signal, and configured to determine an operation state of the switching power supply to generate an operation state signal, the operation state signal is a soft-start state signal or a ON-OFF state signal;

a PWM module connected to the current detection module to acquire the first signal, and connected to the state detection module to acquire the operation state signal, the PWM module being configured to acquire a preset conducting time and a threshold value Tset, and to perform a first switch-off control and a first switch-on control when the operation state signal is the ON-OFF state signal, in which the first switch-off control includes acquiring the first signal and the switch control signal, calculating a time interval Ttap between the zero points of adjacent primary currents of the switching power supply during a present conducting time, and outputting a first control signal at the zero points and the first control signal being the switch-off signal;

the first switch-on control includes comparing the time interval Ttap with a preset threshold value Tset, when Ttap>Tset, controlling the present switch-off time to be less than the switch-off time of a previous cycle, outputting the first control signal and the first control signal being a switch-on signal, when Ttap=0, controlling the present switch-off time to be greater than the switch-off time of the previous cycle, outputting the first control signal and the first control signal being the switch-on signal, when 0<Ttap<=Tset, controlling the present switch-off time to be the same as the switch-off time of the previous switch cycle, outputting the first control signal and the first control signal being the switch-on signal; and the driving module connected to the PWM module to acquire the first control signal and generate the switch control signal, when the first control signal is the switch-on signal, the switch control signal is the switch-on signal, and when the first control signal is the switch-off signal, the switch control signal is the switch-off signal.

The details of one or more embodiments of the present disclosure will be set forth in the following drawings and description. Other characteristics, objectives and advantages of the present disclosure will be more apparent from the specification, drawings and claims.

BRIEF DESCRIPTION OF THE DRAWINGS

To better describe and illustrate those embodiments and/or examples of the disclosure herein, reference may be made to one or more accompanying drawings. Additional details or examples configured to describe the accompanying drawings should not be considered a limitation on the scope of the disclosure, the presently described embodiments and/or examples, and the best embodiments of any of the disclosure as currently understood.

DETAILED DESCRIPTION

Figure 1:
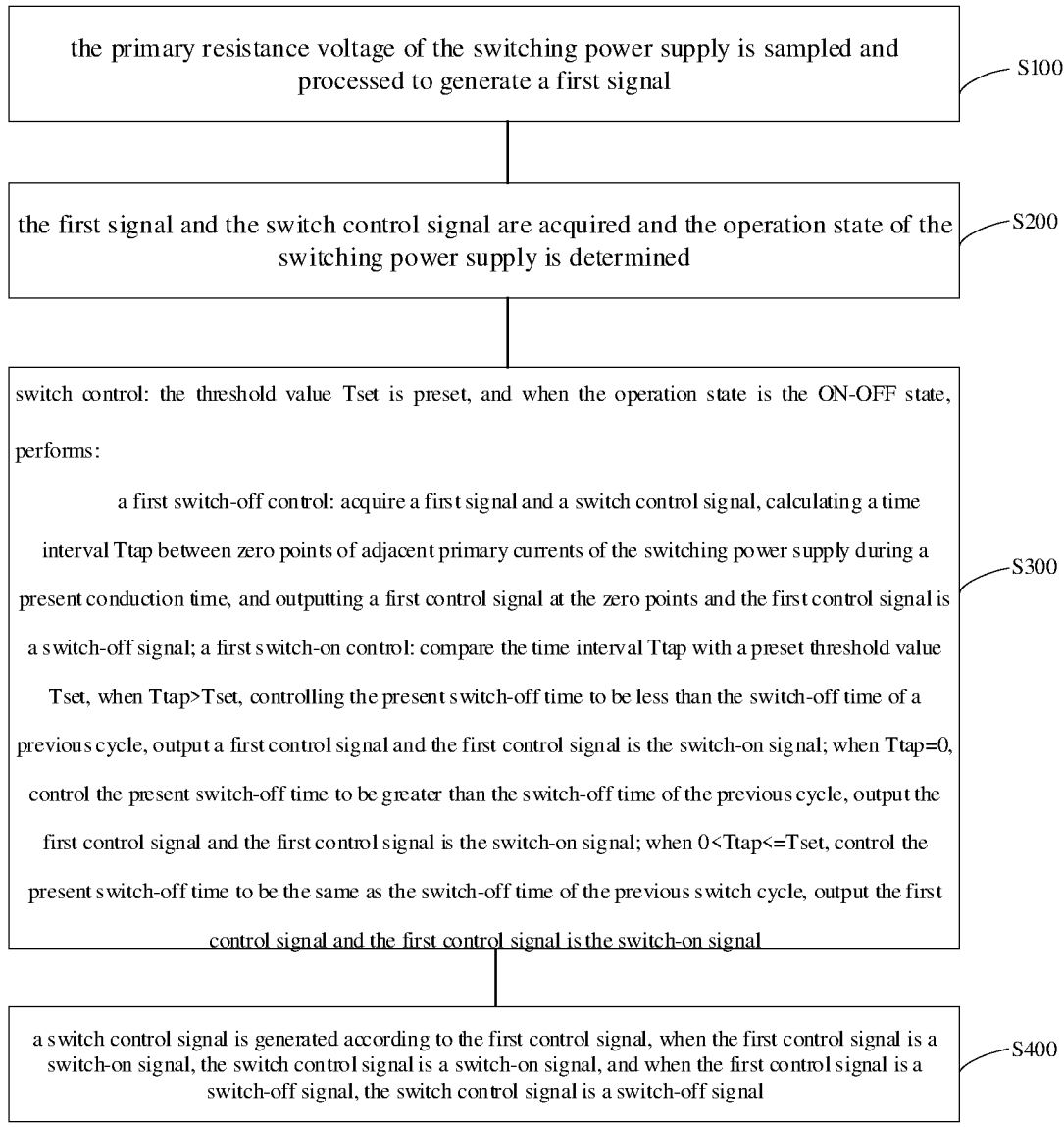
FIG. 1, a flowchart of a method for controlling a resonant switch according to an embodiment of the disclosure.

In an embodiment, as shown in FIG. 1, a control method for a resonant switching power supply includes following steps.

At step S100, a primary resistance voltage of the switching power supply is sampled and processed to generate a first signal.

In a specific embodiment, a current detection module is connected to the primary side of the switching power supply to sample and process the primary resistance voltage of the switching power supply. A comparator COMP1 and a D flip-flop D1 may be provided in the current detection module, in which a positive input end of the comparator COMP1 is connected to the switching power supply to acquire a primary sampling resistance voltage Vs of the switching power supply, the negative input end of the comparator COMP1 is connected to ground, and an output signal of the comparator COMP1 is signal VCOMP1. When a primary current IL changes from a positive value to a negative value, the signal VCOMP1 outputted by the comparator COMP1 changes from 1 to 0. The input signal of the D input end of the D flip-flop D1 is VCOMP1, the input clock signal CLK is a control circuit operation clock CK, and the output signal of the output end Q is signal VCOMP1'. The first signal includes the signal VCOMP1 and the signal VCOMP1'. The zero points of the primary current can be determined by VCOMP1$\oplus$VCOMP1'=1, where the logical operator $\oplus$ represents a logical relationship of exclusive OR.

At step S200, the first signal and the switch control signal are acquired and an operation state of the switching power supply is determined, in which the operation state of the switching power can be a soft-start state or a ON-OFF state.

In a specific embodiment, it is determined from the first signal and the switch control signal whether zero points exist during the conducting time of n consecutive switching cycles for the switching power supply, and the operation state of the switching power supply is determined to be the ON-OFF state when the zero points exist in the conducting time of each of the n consecutive switch cycles, and the operation state is determined to be the soft-start state when zero points do not exist during the conducting time of each of the n consecutive switch cycles, where 5≤n≤20.

The switching power supply includes the ON-OFF state and the soft-start state. In an embodiment, the switching power supply includes a MOS transistor, and the switching power supply is controlled to be switched on and off by controlling the switching on and off of the MOS transistor. Both the first signal and the switch control signal are level signals. The signal VCOMP1 and signal VCOMP1', and the switch control signal Duty are acquired. Since the zero points of the primary current can be determined from VCOMP1$\oplus$VCOMP1'=1, when the switch control signal Duty, the signal VCOMP1, and the signal VCOMP1' satisfy the logical relationship: Duty*(VCOMP1$\oplus$VCOMP1')=1, it indicates that there is a negative value of the primary current of the switching power supply in conducting phase of the switch, that is, there is zero point. When Duty (VCOMP1$\oplus$VCOMP1')=1 occurs in the conducting time of each of the n switch cycles, it is determined that there are zero points in the conducting time of each of the n consecutive switch cycles, and the operation state is ON-OFF. In an embodiment, the operation state signal State is outputted after the operation state is determined, the operation state signal is also a level signal, State=0 indicates the soft-start state, and State=1 indicates the ON-OFF state.

At step S300: switch control: a threshold value Tset is preset, and when the operation state is the ON-OFF state, performs:

a first switch-off control: acquiring a first signal and a switch control signal, calculating a time interval Ttap between zero points of adjacent primary currents of the switching power supply during a currently conducting time, and outputting a first control signal at the zero points in which the first control signal is a switch-off signal; a first switch-on control: comparing the time interval Ttap with a preset threshold value Tset, when Ttap>Tset, controlling the present switch-off time to be less than the switch-off time of a previous cycle, outputting a first control signal which is the switch-on signal; when Ttap=0, controlling the present switch-off time to be greater than the switch-off time of the previous cycle, outputting the first control signal which is the switch-on signal; when 0<Ttap<=Tset, controlling the present switch-off time to be the same as the switch-off time from the previous switch cycle, outputting the first control signal which is the switch-on signal.

In an embodiment, the conducting time and the threshold value Tset are preset. When the operation state is the ON-OFF state, perform the first switch-off control and the first switch-on control. In performing the the first switch-off control: acquire the first signal and the switch control signal, calculate the number of zero points counter2 of the primary current of the switching power supply in the currently conducting time, and calculate the time interval Ttap between adjacent zero points, and when counter2=2 or counter2=0 and the conducting time reaches the preset conducting time, output the first control signal and the first control signal is the switch-off signal. And in performing the first switch-on control: acquire the first signal and the switch control signal, calculate the number of zero points counter3 of a primary current of the switching power supply in a current switch-off time, and compare a time interval Ttap with a preset threshold value Tset; when Ttap>Tset, then when counter3=2, output the first control signal and the first control signal is the switch-on signal; when Ttap=0, then when counter3=4, output the first control signal and the first control signal is the switch-on signal, when 0<Ttap<=Tset, then when counter3=N, output the first control signal and the first control signal is the switch-on signal, in which N is a value of counter3 in a previous switch cycle. The first switch-off control is then repeatedly performed.

In a specific embodiment, a counter Counter2, a counter Counter3, a counter Counter4, and a time counting unit are configured. The time counting unit is configured to count a time length Ttap at counter2>=1 and counter2<=2 in the state of State=1; the counter Counter2 is configured to count the number of zero points counter2 of the primary current in the conducting phase of the MOS transistor, and when Duty=1 and VCOMP1$\oplus$COMP1'=1, Counter2 starts counting; when Duty=0, Counter2 is cleared. The counter Counter3 is configured to count the number of zero points counter3 of the primary current in the switch-off phase of the MOS transistor, and when Duty=0 and VCOMP1$\oplus$COMP1'=1, the counter Counter3 starts counting; when Duty=1, the counter Counter3 is cleared. The counter Counter4 is configured to control the conducting time of the MOS transistor in the soft-start state and the switch-off of the MOS transistor when the primary current in the ON-OFF state is constantly greater than zero (i.e., Ttap=0) in the conducting phase of the MOS transistor, and when Duty=1, the counter Counter4 starts counting; and when Duty=0, Counter4 is cleared.

Figure 6A:
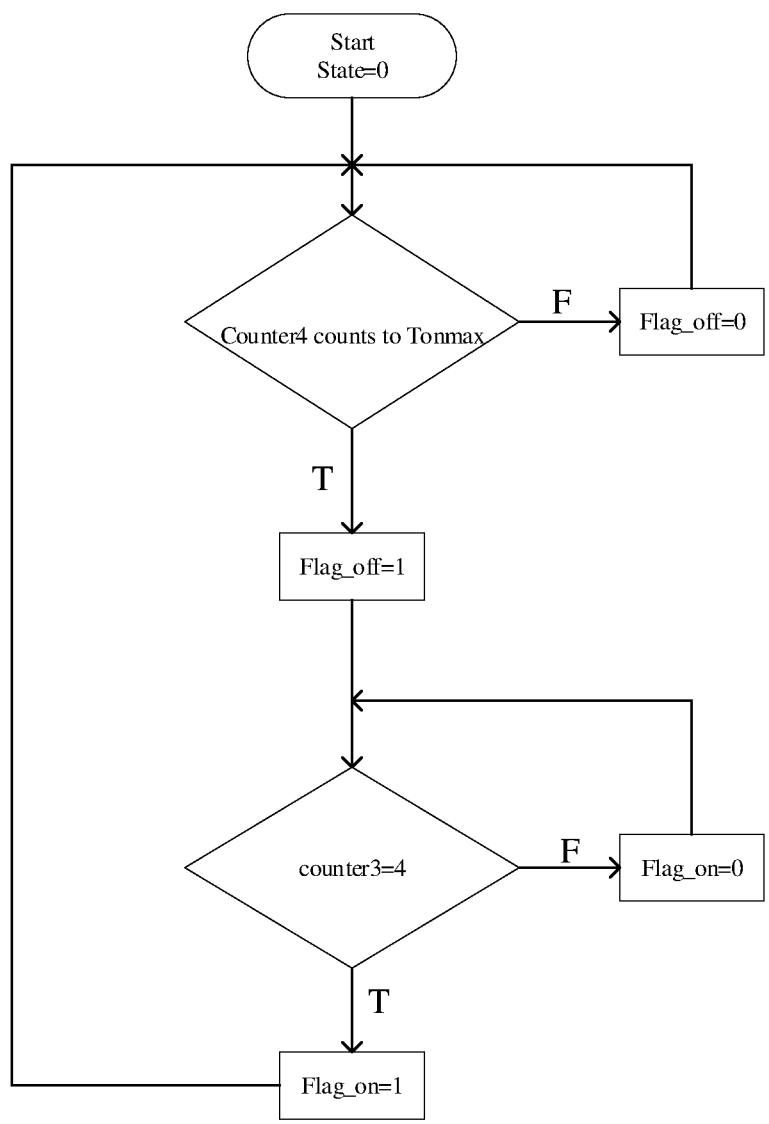
FIG. 6a is a flowchart of an algorithm of a soft-start state of a PWM module according to an embodiment of the disclosure.

In an embodiment, the first control signal includes a switch-on signal Flag_on, a switch-off signal Flag_off. When the first control signal is the switch-on signal, the signal Flag_on is on, and the signal Flag_off is off. When the first control signal is the switch-on signal, when the control system is in the soft-start state to be set to 1, the switch-off signal Flag_off is set to 1. When the control system is in the soft-start state, that is, State=0, a fixed conducting time of the primary MOS transistor is Tonmax, and when the counter Counter4 counts to the system given conducting time Tonmax, the MOS transistor switch-off signal Flag_off is set to 1 and inputted to the driving module; then, the counter Counter3 counts the zero points of the primary current after the primary MOS transistor is switch-off. When counter3=4, that is, the second valley corresponding to the drain-source voltage Vds of the MOS transistor, the MOS transistor switch-on signal Flag_on is set to 1 and inputted to the driving module. FIG. 6a shows the operation flow of the PWM module in the soft-start state.

Figure 6B:
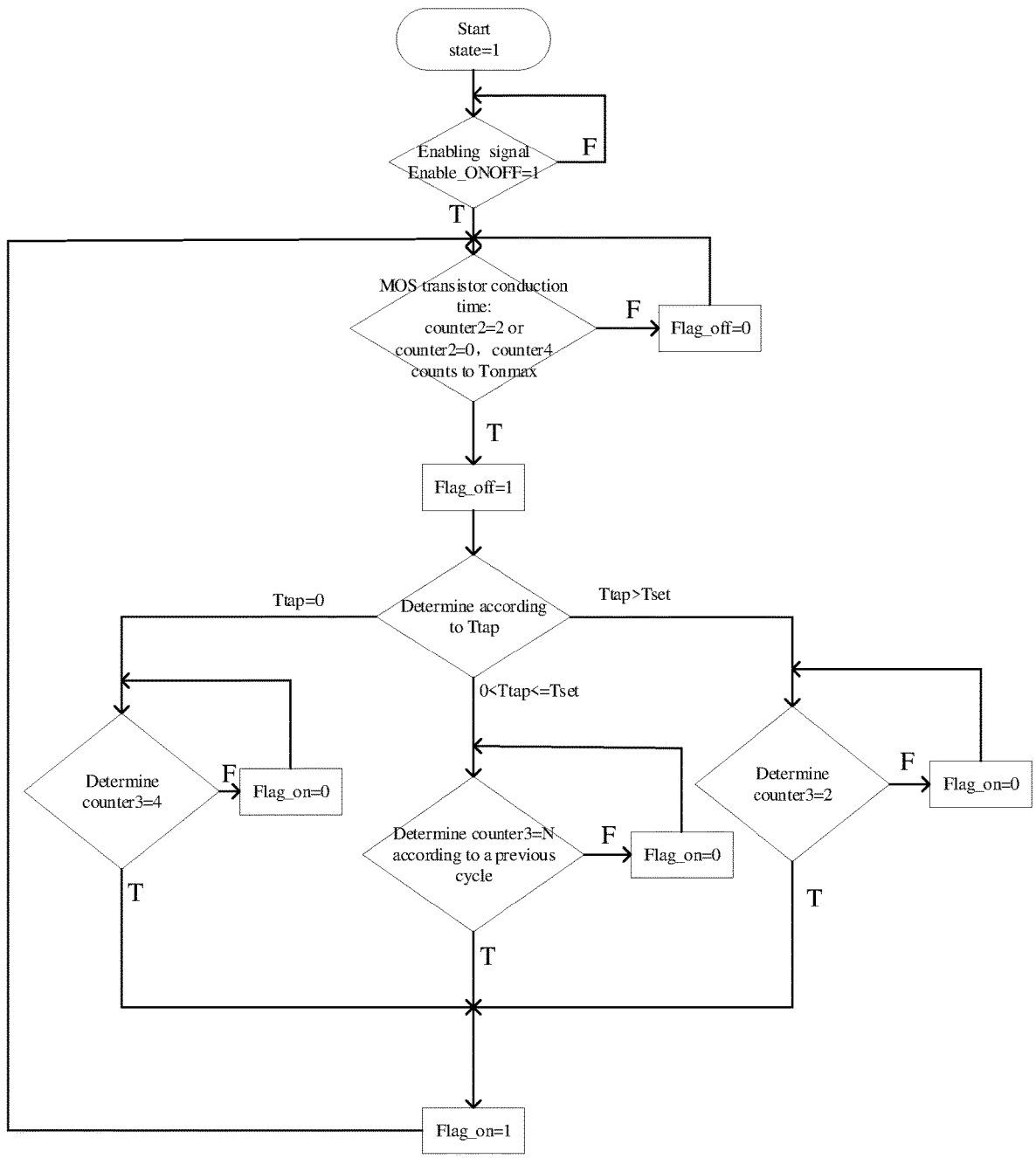
FIG. 6b is a flowchart of an algorithm of an ON-OFF state according to an embodiment of the disclosure.
Figure 6C:
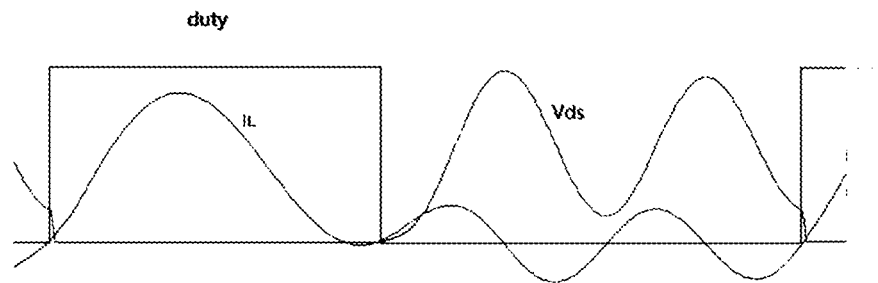
FIG. 6c is a waveform diagram of an ON-OFF state according to an example of the disclosure.
Figure 6D:
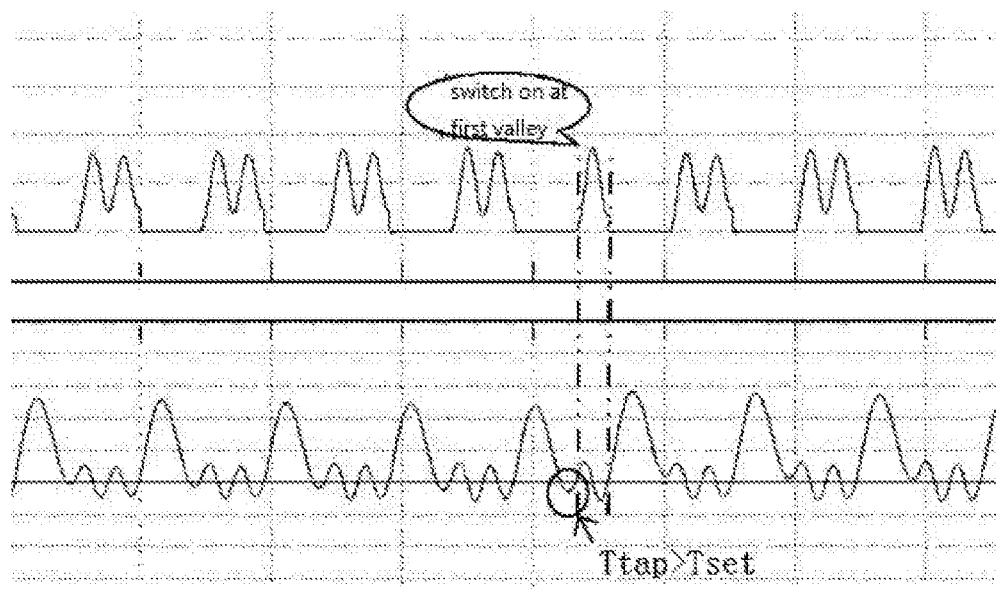
FIG. 6d is a waveform diagram of an ON-OFF state according to an example of the disclosure.

When the control system is in the ON-OFF state, i.e., State=1, the PWM module operation flow in the ON-OFF state is shown in FIG. 6b. The MOS transistor switch-off signal Flag_off is set to 1 when the zero points of the primary current of the MOS transistor in the conducting phase counted by the counter2 reaches 2, or when counter2=0 and the counter Counter4 counts to the system given conducting time Tonmax. As shown in FIG. 6c, the MOS transistor switch-off signal Flag_off is set to 1 when the zero points of the primary current of the MOS transistor in the conducting phase counted by the counter2 reaches 2. As for when the switch-on signal Flag_off is set to 1, it is first necessary to discuss the problem of the optimal operation point: in the MOS transistor ON phase, the time length Ttap is calculated by the time calculation unit when counter2>=1 and counter2<=2, when Ttap is small or the primary current is just greater than zero when the MOS transistor is switched on, the switching loss of the circuit is small and the energy returned to the power supply is small, this is the optimal operation point of the circuit, and the overall efficiency of the circuit is high. FIG. 6c shows a case in which Ttap is small. At counter2=2, the MOS transistor switch-off signal Flag_off=1, a zero current switch-off is realized, and the MOS transistor switch-on signal Flag_on is set to 1 at the fourth zero point of the primary current after the MOS transistor is switch-off, which corresponds to a second valley of the drain-source voltage Vds of the MOS transistor, a quasi-zero voltage switch on is realized. Therefore, in order to ensure that the circuit always operates in the vicinity of the optimal operation point, the system gives a threshold value Tset of the Ttap. On the premise of the ON-OFF enabling signal Enable_ON-OFF=1, as shown in FIG. 6b, when Ttap>Tset, it indicates that the current operation point is far away from the optimal operation point, the MOS transistor is switched on at a first valley when the drain-source voltage Vds resonates after the primary MOS transistor is switched off at the current operation cycle, that is, when counter3=2, the MOS transistor switch-on signal Flag_on is set to 1, so that the quasi-zero voltage switch-on is ensured while the MOS transistor switch-off time is reduced, the primary current of the next operation cycle is pulled up as a whole, and the Ttap is reduced, so that the operation point of the next operation cycle circuit is close to the optimal operation point. When Ttap=0, the primary current of the current operation cycle is always greater than zero in the conducting phase (the conducting time of the MOS transistor at this time is limited by Tonmax) of the MOS transistor, that is, there are no zero points, in the current operation cycle, the MOS transistor is switched on at the second valley when the drain-source voltage Vds resonates after the primary MOS transistor is switched off, that is, when counter3=4, the MOS transistor switch-on signal Flag_on is set to 1, in the next operation cycle, the primary current is pulled down as a whole, so that in the next operation cycle the operation point of the circuit is close to the optimal operation point; when 0<Ttap<=Tset, the operation point of the circuit in the current operation cycle is ideal and close to the optimal operation point, the operation state from the previous cycle is maintained, that is, counter3=N (N corresponds to the operation state from the previous operation cycle, and in the last operation cycle, the MOS transistor is switched on at the second valley when the drain-source voltage Vds resonates after the MOS transistor is switched off, then N=4; when the MOS transistor is switched on at the first valley when the drain-source voltage Vds resonates after the MOS transistor is switched off, then N=2), and the MOS transistor switch-on signal Flag_on is set to 1. FIG. 6d illustrates a case where the MOS transistor drain-source voltage Vds being switched on at the second valley and being switched on at the first valley are switched. The PWM module outputs the MOS transistor switch-off signal Flag_off and the MOS transistor switch-on signal Flag_on to the driving module to control the switch transistor duty ratio signal Duty.

At step S400: a switch control signal is generated according to the first control signal, when the first control signal is a switch-on signal, the switch control signal is a switch-on signal, and when the first control signal is a switch-off signal, the switch control signal is a switch-off signal.

In an embodiment, the method further includes ripple regulation: preset an output voltage upper limit Vmax and an output voltage lower limit Vmin, acquire an output voltage Vo of the switching power supply, compare the output voltage Vo, the output voltage upper limit Vmax, and the output voltage lower limit Vmin when the operation state is the ON-OFF state, and output a second control signal, and when Vo>Vmax, the second control signal is the switch-off signal, and when Vo<Vmin, the second control signal is the switch-on signal. At this time, at step S300, the second control signal needs to be acquired, and when the second control signal is the switch-on signal, the first switch-off control is performed. In a specific embodiment, the second control signal is an enabling signal Enable_ON-OFF, and when State=0, the ON-OFF enabling signal Enable_ON-OFF is set to zero; when State=1, that is, in the ON-OFF state, the output voltage Vo exceeds the upper limit Vmax, the ON-OFF enabling signal Enable_ON-OFF=0, the circuit enters the OFF state, the MOS transistor is switched off, the primary winding does not transmit energy to the secondary winding, and the output voltage Vo starts to decrease until the output voltage Vo is lower than the lower limit Vmin, the ON-OFF enabling signal Enable_ON-OFF=1, and the circuit enters the ON state. This cycling stabilizes the output voltage within a certain ripple range. At this time, at step S400, when the operation state signal State equals 0, i.e., in the soft-start state, the switch control signal Duty is set to 1 when the MOS transistor switch-on signal Flag_on=1 and set to 0 when the MOS transistor switch-off signal Flag_off=1. When the operation state signal State equals 1, i.e., the ON-OFF state, and the ON-OFF enabling signal Enable_ON-OFF equals 0, the circuit is in the OFF state, and the switch transistor duty ratio signal Duty is set to 0; When the ON-OFF enabling signal Enable_ON-OFF equals 1, the circuit is in the ON state, and the switch control signal Duty is set to 1 when the MOS transistor switch-on signal Flag_on equals 1 and set to 0 when the MOS transistor switch-off signal Flag_off equals 1, the operation flow is shown in FIG. 7$b$. The method for improving the CCM conversion efficiency of a flyback resonant switching power supply is based on a control system including a current detection module, a state detection module, an output feedback module, a PWM module, and a drive module, where the control system is connected to a controlled switching power supply to form a closed loop.

Advantages of the present disclosure are that a zero current or zero voltage switching of the switch transistor is accurately realized, switching loss of the power supply is effectively reduced, power supply efficiency is improved, and output voltage is effectively stabilized in a certain ripple range, so that an effective control of the output voltage is realized. At the same time, the present solution can be applied to isolated or non-isolated switching power supply circuit structures, and thus has versatility, reusability, and portability. The above process is repeated to cyclically control the switching on and off of the switching power supply power transistor so as to make the system more stable and obtain higher operation efficiency.

Figure 2:
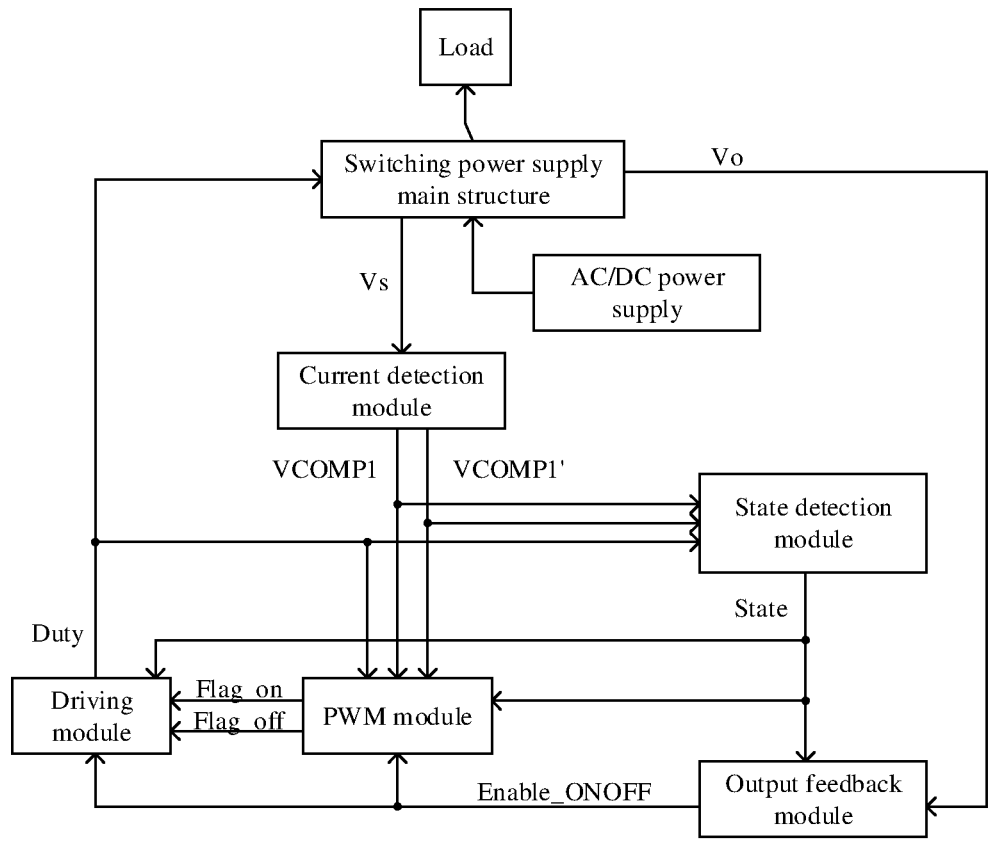
FIG. 2 is a block diagram of a system structure of a control system for a resonant switching power supply according to an embodiment of the disclosure.
Figure 3:
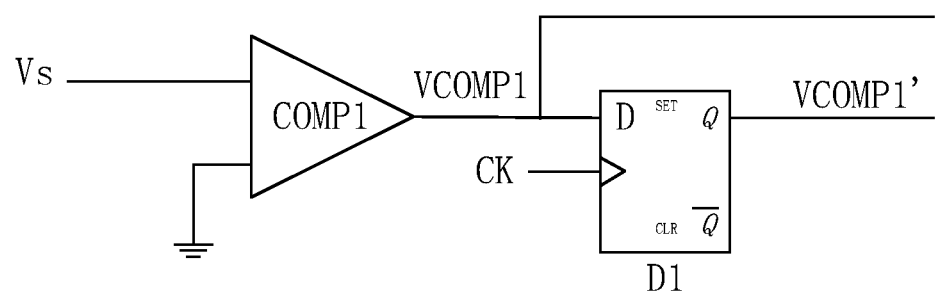
FIG. 3 is a block diagram of a current detection module according to an embodiment of the disclosure.

The present disclosure also relates to a control system for controlling a resonant switching power supply. As shown in FIG. 2, the system includes a current detection module, a state detection module, a PWM module, and a driving module.

The current detection module is configured to sample a primary resistance voltage of the switching power supply, and process the primary sampling resistance voltage to output a first signal.

In an embodiment, the current detection module includes a comparator COMP1 and a D flip-flop D1, a positive input end of the current detection module is connected to the switching power supply to acquire the primary sampling resistance voltage Vs of the switching power supply, a negative input end is connected to ground, and the output signal is signal VCOMP1. When the primary current IL changes from a positive value to a negative value, the signal VCOMP1 outputted by the comparator COMP1 changes from 1 to 0; the input signal of the D input end of the D flip-flop D1 is VCOMP1, the input clock signal CLK is a control circuit operating clock CK, and the output signal of the output end Q is signal VCOMP1'. The zero points of the primary current can be determined by VCOMP1$\oplus$VCOMP1'=1, where the logical operator $\oplus$ represents a logical relationship of exclusive OR.

The state detection module is connected to the current detection module to acquire the first signal, is connected to the driving module to acquire the switch control signal, and is configured to determine an operation state of the switching power supply to generate an operation state signal in which the operation state signal is a soft-start state signal or a ON-OFF state signal.

Figure 4A:
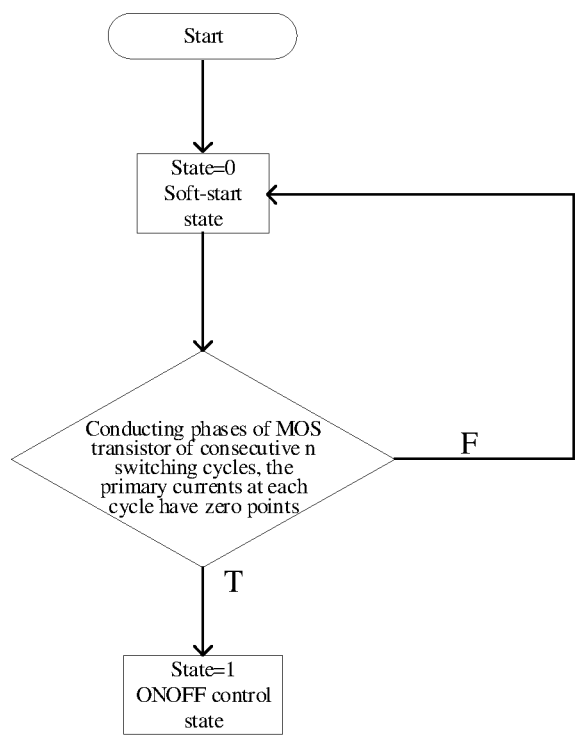
FIG. 4a is a flowchart of detecting a state according to an embodiment of the disclosure.
Figure 4B:
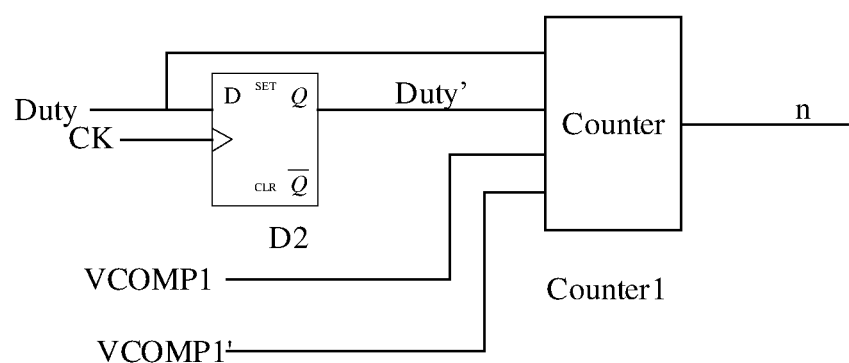
FIG. 4b is block diagram of a state detection module according to an embodiment of the disclosure.

In a specific embodiment, as shown in FIG. 4$b$, the state detection module includes a counter Counter1 and a D flip-flop D2, the D input end of the D flip-flop D2 is connected to the output end of the driving module to acquire a switch control signal Duty of the output of the driving module, the output signal of the D flip-flop D2 is Duty', the input end of the counter Counter1 is connected to the output end of the D flip-flop D2 to acquire the output signal Duty', and the output end of the counter Counter1 is connected to the driving module to acquire the switch control signal Duty, and is connected to the current detection module to acquire the signal VCOMP1 and the signal VCOMP1', respectively. After the system is powered on, the initial state of the state detection module is State=0. When the switch control signal Duty and the current detection module output signals VCOMP1, VCOMP1' satisfy the logic relationship: Duty*(VCOMP1$\oplus$VCOMP1')=1, it indicates that there is a negative value of the primary current of the switching power supply in the conducting phase, and the counter Counter1 starts counting counter1=counter1+1. A switching power supply includes a MOS transistor (Metal-Oxide-Semiconductor Field-Effect Transistor, MOSFET), and switches on and off of the switching power supply by controlling on and off of the MOS transistor. If the primary current has zero points during the conducting phase of each of n (5<=n<=20) consecutive switching cycles of the MOS transistor, it can be shown that the circuit is stable and enter the ON-OFF state. Therefore, a D flip-flop D2 is introduced and a temporary variable counter_Temp with an initial value assigned to 0 is introduced to determine whether the counter1 is increased in the consecutive cycles. The D input end of the D flip-flop D2 is connected to the switch control signal Duty, and the input clock signal CLK is the control circuit operation clock CK, and the output signal at the Q output end is Duty'. The circuit thereof is shown in FIG. 4$b$, the counter1 part is implemented by an algorithm, and when Duty equals 0, Duty$\oplus$Duty'=1 and counter_Temp<counter1, the value of the counter Counter1 is assigned to counter_Temp, that is, counter_Temp=counter1; when Duty equals 0, Duty$\oplus$Duty'=1 and counter1=counter_Temp, both the counters Counter1 and counter_Temp are cleared. When counter1 reaches n (5<=n<=20), that is, consecutive n (5<=n<=20) switching cycle MOS transistor conducting phases, and the primary connection IL of the switching power supply has a negative value, it is determined that the switching power supply circuit is stable, and then state detection module outputs the operation state signal State=1, that is, the soft-start state is jumped out to enter the ON-OFF state. The workflow of the state detection module may be summarized in FIG. 4$a$. At the beginning of the soft-start, the output voltage Vo of the switching power supply is low, such that the primary current IL is always greater than 0 in the conduction state. As the switching time increases, when the primary current IL is stable and has a negative current, it indicates that the system is stable and can enter the ON-OFF state.

The PWM module is connected to the current detection module to acquire a first signal, and connected to the state detection module to acquire an operation state signal, the PWM module is configured to acquire a preset conducting time and a threshold value Tset, and to perform a first switch-off control and a first switch-on control when the operation state signal is the ON-OFF state signal, the first switch-off control includes: acquire the first signal and the switch control signal, calculate a time interval Ttap between zero points of adjacent primary currents of the switching power supply in a current conducting time, output the first control signal at the zero points and the first control signal is a switch-off signal, specifically, it is to calculate a number of zero points counter2 of the primary currents of the switching power supply in the current conducting time based on the first signal and the switch control signal, and calculate a time interval Ttap between adjacent zero points, when counter2=2, or when counter2=0 and the conducting time reach the preset conducting time, output the first control signal and the first control signal is a switch-off signal; the first switch-on control includes: compare the time interval Ttap with a preset threshold value Tset, when Ttap>Tset, control the present switch-off time to be less than the switch-off time of the previous cycle, output the first control signal and the first control signal is the switch-on signal, when Ttap=0, control the switch-off time between the current switch-off and the previous cycle to be greater than the switch-off time of the previous cycle, output the first control signal and the first control signal is the switch-on signal, when 0<Ttap<=Tset, control the present switch-off time to be the same as the switch-off time of the previous switch cycle, output the first control signal and the first control signal is the switch-on signal, specifically it is to calculate the number of zero points counter3 of the primary current in the present switch-off time according to the first signal and the switch control signal, and compare the relationship between the time interval Ttap and the preset threshold value Tset, when Ttap>Tset, then when counter3=2, output the first control signal and the first control signal is the switch-on signal, or when Ttap=0, then when counter3=4, output the first control signal and the first control signal is the switch-on signal, or when 0<Ttap<=Tset, then when counter3=N, output the first control signal and the first control signal is a switch-on signal, and N is the value of counter3 from the previous switch cycle.

In a specific embodiment, the PWM module includes a counter Counter2, a counter Counter3, a counter Counter4 and a time counting unit. The time counting unit is configured to count a time length Ttap when counter2>=1 and counter2<=2 in the State=1 state; the counter Counter2 is configured to count the number of zero points of the primary current in the conducting phase of the MOS transistor, and when Duty=1, VCOMP1⊕COMP1'=1, Counter2 starts counting; when Duty=0, Counter2 is cleared. The counter Counter3 is configured to count the number of zero points of the primary current in the switch-off phase of the MOS transistor, and when Duty=0, VCOMP1⊕COMP1'=1, Counter3 starts counting; when Duty=1, Counter3 is cleared. The counter Counter4 is configured to control the conducting time of the MOS transistor in the soft-start state, and the switch-off of the MOS transistor when the primary current in the ON-OFF state is constantly greater than zero (i.e., Ttap=0) in the conducting phase of the MOS transistor, when Duty=1, the counter Counter4 starts counting; and when Duty=0, Counter4 is cleared.

The driving module is connected to the PWM module to acquire a first control signal and generate a switch control signal. When the first control signal is a switch-on signal, the switch control signal is a switch-on signal, and when the first control signal is a switch-off signal, the switch control signal is a switch-off signal.

Figure 5A:
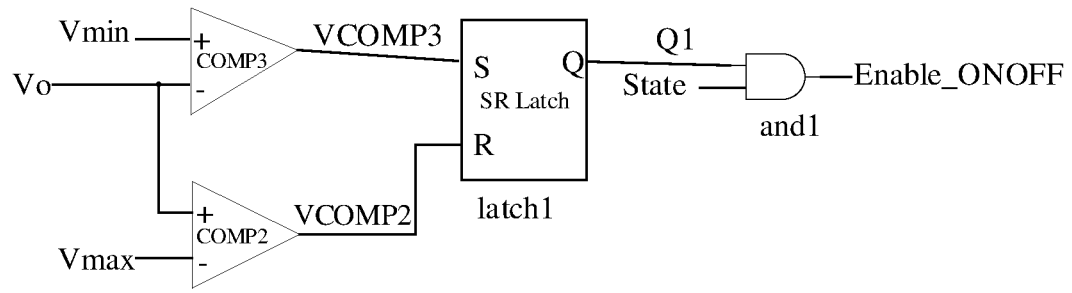
FIG. 5a is a block diagram of an output feedback module according to an embodiment of the disclosure.
Figure 5B:
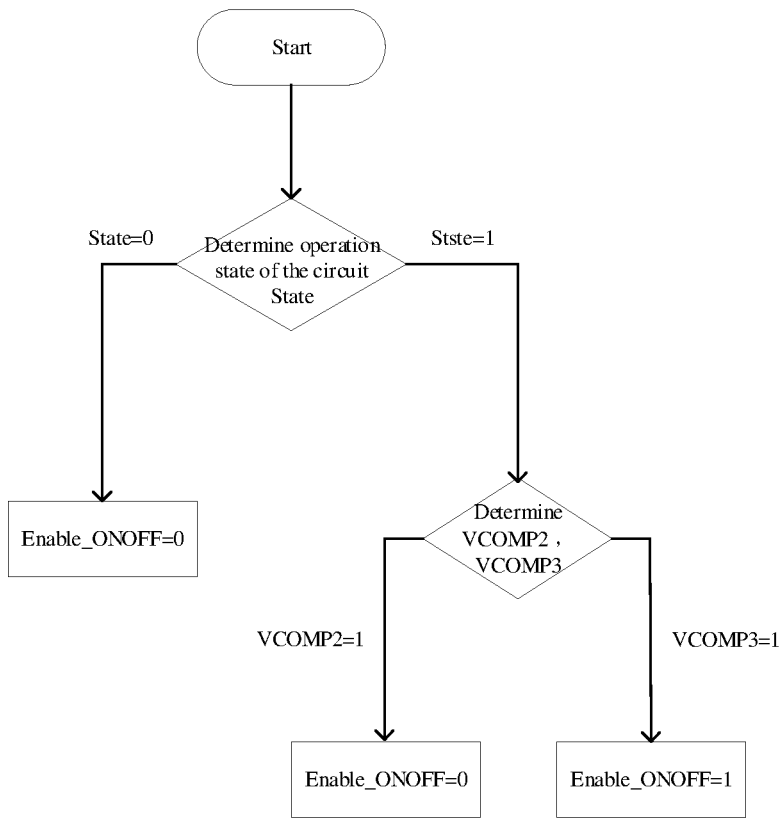
FIG. 5b is a flowchart of a ripple regulation according to an embodiment of the disclosure.

In an embodiment, the system further includes an output feedback module connected to the state detection module to acquire an operation state signal, and to acquire an output voltage upper limit Vmax and an output voltage lower limit Vmin and an output voltage Vo of the switching power supply, and to compare the output voltage Vo with a preset output voltage upper limit Vmax and a preset output voltage lower limit Vmin when the operation state signal is a ON-OFF state signal, and to output a second control signal, and when Vo>Vmax, the second control signal is a switch-off signal, and when Vo<Vmin, the second control signal is a switch-on signal. In an embodiment, as shown in FIG. 5a, the output feedback module includes two comparators COMP2 and COMP3 and a SR latch Latch1. A positive input end of COMP2 is connected to the switching power supply to acquire an output voltage Vo of the switching power supply, and a negative input end is connected to an output voltage upper limit Vmax of the switching power supply. When the output voltage Vo exceeds the upper limit Vmax, the comparator COMP2 outputs signal VCOMP2=1 and is connected to the R end of the SR latch Latch1, and sets the output signal Q1 of the SR latch Latch1 to zero. The positive input end of COMP3 is connected to the output voltage lower limit Vmin of the switching power supply, and the negative input end is connected to the switching power supply to acquire the output voltage Vo of the switching power supply. When the output voltage Vo is lower than the lower limit Vmin, the comparator COMP3 outputs the signal VCOMP3=1 and is connected to the S end of the SR latch Latch1, and sets the output signal Q1 to 1. The output signal Q1 of the SR latch Latch1 and the state control signal State are inputted to the AND gate and1, and the AND gate and1 outputs the ON-OFF enabling signal Enable_ON-OFF, that is, when State=0, the ON-OFF enabling signal Enable_ON-OFF is set to zero; When State=1, that is, in the ON-OFF state, the output voltage Vo exceeds the upper limit Vmax, the ON-OFF enabling signal Enable_ON-OFF=0, the circuit enters the OFF state, the MOS transistor is switched off, the primary winding does not transmit energy to the secondary winding, and the output voltage Vo starts to decrease until the output voltage Vo is lower than the lower limit Vmin, the ON-OFF enabling signal Enable_ON-OFF=1, and the circuit enters the ON state. This cycling stabilizes the output voltage within a certain ripple range. The workflow is generally shown in FIG. 5b. The output feedback module outputs the ON-OFF enabling signal Enable_ON-OFF to the driving module and the PWM module.

Figure 7A:
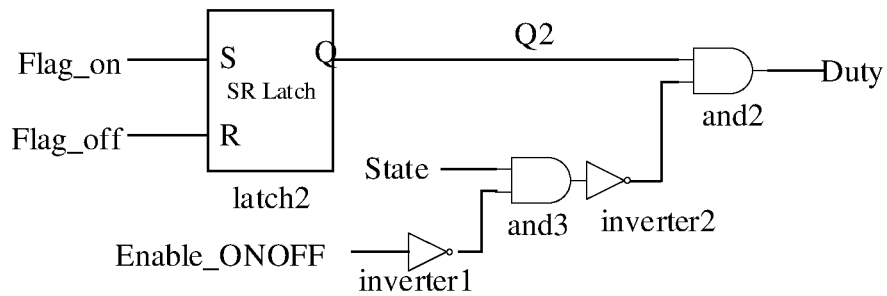
FIG. 7a is a block diagram of a drive module according to an embodiment of the disclosure.
Figure 7B:
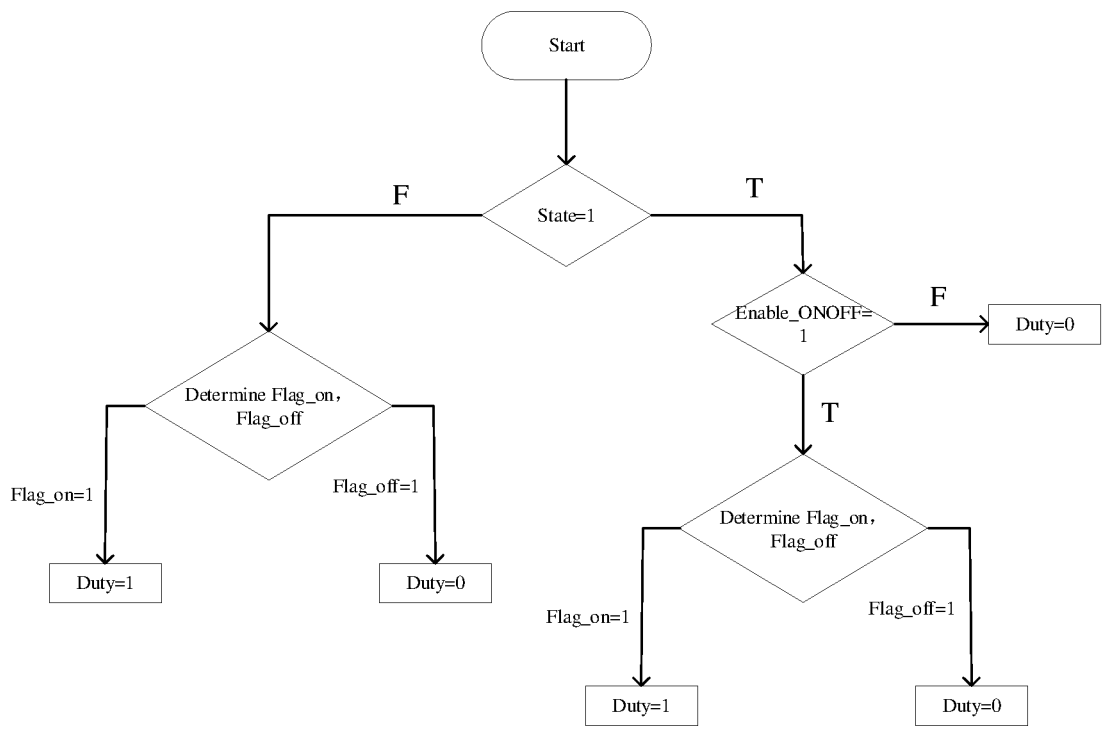
FIG. 7b is a flowchart of a drive output according to an embodiment of the disclosure.
Figure 8:
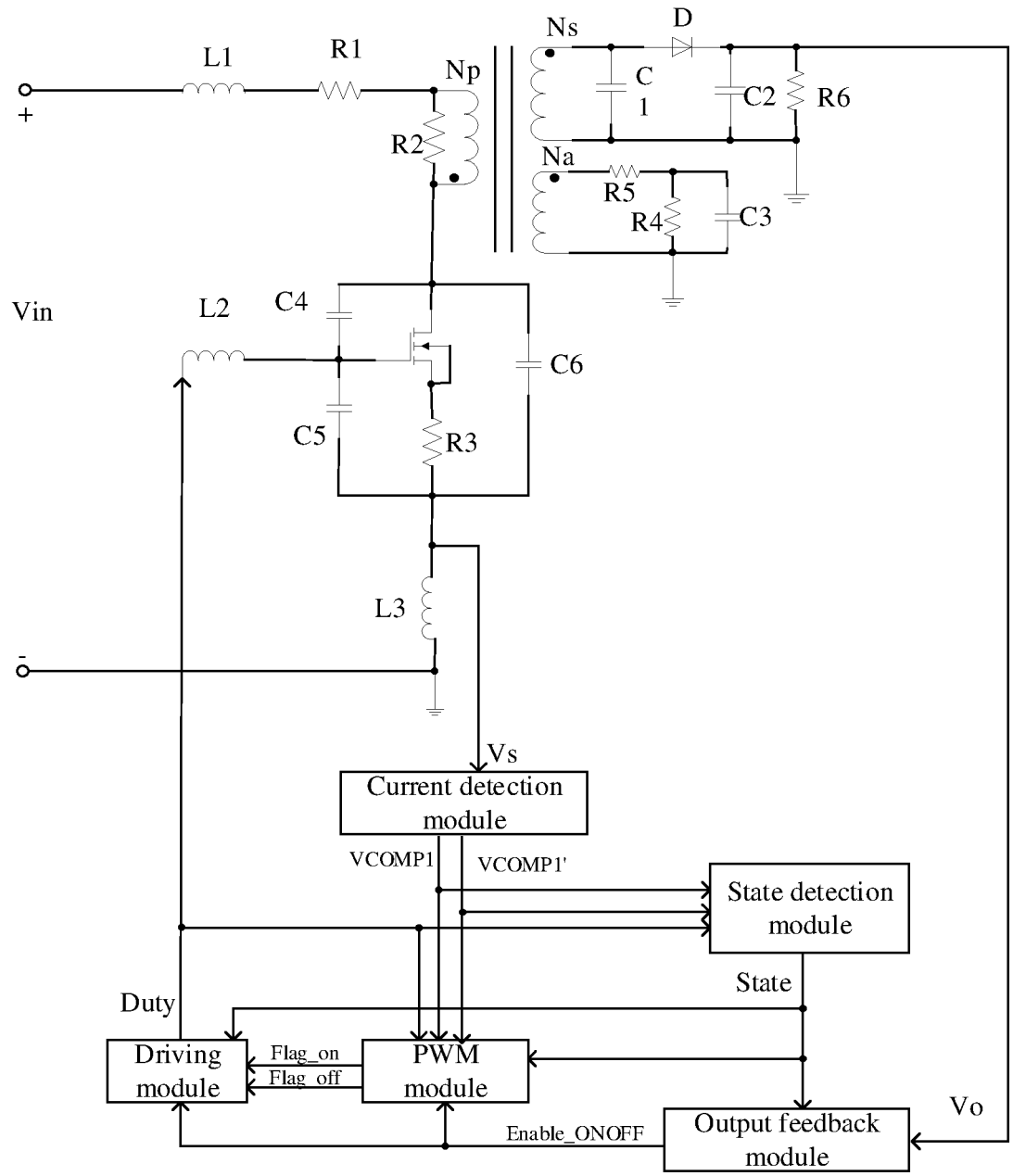
FIG. 8 is a schematic diagram of a closed-loop circuit of a CCM flyback resonant switching power supply according to an embodiment of the disclosure.

In an embodiment, as shown in FIG. 7a, the driving module includes a SR latch Latch2, an AND gate and2, an AND gate and3, an inverter inverter1, and an inverter inverter2, the S input end of the SR latch Latch2 is connected to the switch-on signal Flag_on, the R input end of the SR latch Latch2 is connected to the switch-off signal Flag_off, the output end of the SR latch Latch2 is connected to the input end of the AND gate and2, the input end of the inverter inverter1 is connected to the enabling signal Enable_ON-OFF, the input end of the AND gate and3 is connected to the operation state signal State and to the output of the inverter inverter1, and the inverter inverter2 is connected between the input end of the AND gate and2 and the output end of the AND gate and3. As shown in FIG. 7b, when the operation state signal State=0 is in the soft-start state, the switch control signal Duty is set to 1 when the MOS transistor switch-on signal Flag_on=1 and set to 0 when the MOS transistor switch-off signal Flag_off=1. When the operation state signal State=1, i.e., in the ON-OFF state, when the ON-OFF enabling signal Enable_ON-OFF=0, the circuit is in the OFF state, and the switch transistor duty ratio signal Duty is set to 0; when the ON-OFF enabling signal Enable_ON-OFF=1, the circuit is in the ON state, and the switch control signal Duty is set to 1 when the MOS transistor switch-on signal Flag_on=1 and set to 0 when the MOS transistor switch-off signal Flag_off=1.

The above process is repeated to cyclically control the switching on and off of the switching power supply power transistor so as to make the system more stable and to obtain higher operation efficiency.

The present disclosure has been illustrated by the described embodiments, but it is to be understood that the described embodiments are for purposes of illustration and illustration only and are not intended to limit the disclosure to the scope of the described embodiments. Furthermore, it will be appreciated by those skilled in the art that the present disclosure is not limited to the described embodiments, and that many variations and modifications may be made in accordance with the teachings of the present disclosure, all of which fall within the scope of the invention as claimed herein. The scope of protection of this disclosure is defined by the appended claims and their equivalents.

What is claimed is:

1. A method for improving CCM conversion efficiency of a flyback resonant switching power supply based on a control system of a soft-switch flyback resonant circuit, wherein the control system comprising a current detection module, a state detection module, a PWM module, an output feedback module, and a drive module is connected to a controlled switching power supply to form a closed loop, and the control system controls the switching power supply in a soft-start state or a ON-OFF state and based on a ON-OFF control method:

the current detection module being configured to collect basic parameters for implementing a constant voltage algorithm, the current detection module comprising a comparator COMP1 and a D flip-flop D1, a positive end of the comparator COMP1 being connected to an primary sampling resistance voltage Vs, a negative end being grounded, the comparator COMP1 outputting a signal VCOMP1 to a D input end of the D flip-flop D1, and a clock end of the D flip-flop D1 being connected to the clock signal CLK as a working clock of the system, an output end Q of the D flip-flop D1 outputting a signal VCOMP1', both comparison signals VCOMP1 and VCOMP1' being outputted to the state detection module and the PWM module;

the state detection module being configured to determine whether an operation state of the control system being a soft-start state or an ON-OFF state, the state detection module comprising a counter Counter1 and a D flip-flop D2, input signals of the state detection module being the comparison signals VCOMP1 and VCOMP1' which are outputted by the current detection module and a switch control signal Duty outputted by the driving module, output signals of the state detection module being operation state signals State outputted to the output feedback module, the PWM module, and the driving module; defining State=0 as the soft-start state and State=1 as the ON-OFF state; an input end D of the D flip-flop D2 being connected to the switch control signal Duty outputted by the driving module, the clock signal CLK being inputted to the clock end of the D flip-flop D2 as a working clock CK of the system, an output end Q of the D flip-flop D2 outputting comparison signals VCOMP1, VCOMP1', the comparison signals VCOMP1, VCOMP1' and the switch control signal Duty outputted by the driving module and the output signal Duty' of the D flip-flop D2 being input signals of the counter Counter1 and the counter Counter1 outputting the operation state signal State;

the output feedback module being configured to control a ripple size of an output voltage Vo of the switching power supply in the ON-OFF state; input signals of the output feedback module being a secondary output voltage Vo and the operation state signal State outputted by the state detection module, the output feedback module comprising two comparators COMP2 and COMP3 and a SR latch Latch1; the comparator COMP2 comparing the output voltage Vo with an output voltage upper limit Vmax and outputting VCOMP2 to a R end of the SR latch Latch1, the comparator COMP3 comparing the output voltage Vo with an output voltage lower limit Vmin and outputting VCOMP3 to a S end of the SR latch Latch1, a positive end of the comparator COMP2 being connected to the Vo, a negative end being connected to the output voltage upper limit Vmax, the output being VCOMP2, a positive end of the comparator COMP3 being connected to the output voltage lower limit Vmin, the negative end being connected to Vo, the output being VCOMP3, an output signal and a state control signal outputted by a Q end of the SR latch Latch1 being two input signals of an AND gate And1, an output of the AND gate being an ON-OFF enabling signal Enable_ON-OFF to be outputted to the drive module and the PWM module;

the PWM module being configured to control a conducting time and switch-off time of a MOS transistor of the switching power supply, to realize a zero current ZCS switch-off and a quasi-zero voltage ZVS switch-on of the original MOS transistor, and to minimize a switching loss of the original MOS transistor; input signals of the PWM module being an ON-OFF enabling signal Enable_ON-OFF outputted by the output feedback module, the operation state signal State outputted by the state detection module, the comparison signals VCOMP1 and VCOMP1' outputted by the current detection module and the switch control signal Duty outputted by the drive module, the output signals of the PWM module being a MOS transistor switch-off signal Flag_off and a MOS transistor switch-on signal Flag_on inputted to the drive module, so that the switch control signal Duty can be modulated based on the two different operation states of the soft-start and the ON-OFF; and inputs of the driving module being the MOS transistor switch-off signal Flag_off and the MOS transistor switch-on signal Flag_on outputted by the PWM module, the operation state signal State outputted by the state detecting module, and the ON-OFF switch-on signal Enable_ON-OFF outputted by the output feedback module, the driving module outputting a modulated corresponding duty ratio switch control signal Duty to control a switch-on and a switch-off of a power transistor of the switching power supply and realize an improvement to an efficiency of the switching power supply.

2. The method for improving the CCM conversion efficiency of the flyback resonant switching power supply according to claim 1, wherein the state detecting module is in an initial state of State=0 after the system is powered on, when the switch control signal Duty and the current detecting module output signals VCOMP1, VCOMP1' satisfies Duty*(VCOMP1$\oplus$VCOMP1')=1, a counter starts counting counter1=counter1+1; when Duty=0, Duty$\oplus$Duty'=1 and counter_Temp<counter 1, the value of the counter Counter1 is assigned to a temporary variable counter_Temp whose initial value is 0, that is, counter_Temp=counter1; When Duty=0, Duty$\oplus$Duty'=1 and counter_Temp=counter 1, the counters Counter1 and counter_Temp are both cleared; when counter1 reaches n, 5<=n<=20, i.e., n consecutive switch cycles, the primary current has a negative current in the conducting phase of the MOS transistor, indicating that the circuit state is stable, then the operation state signal State=1 is outputted, i.e., the soft-start state is jumped out and into the ON-OFF state, wherein the logic operator ⊕ indicates a logic relationship of exclusive OR.

3. The method for improving the CCM conversion efficiency of the flyback resonant switching power supply according to claim 1, wherein the output feedback module sets the ON-OFF enabling signal Enable_ON-OFF to zero when the system is in the State=0 i.e. soft-start state; when the system is in the State=1, i.e., ON-OFF state, and VCOMP2=1, the ON-OFF enabling signal Enable_ON-OFF=0, the system enters the OFF state, the MOS transistor is switched off, a primary winding no longer transmits energy to the secondary winding, a secondary output voltage Vo starts to fall down until VCOMP3=1, the ON-OFF enabling signal Enable_ON-OFF=1, the system enters the ON state, the MOS transistor is switched on, and the output feedback module outputs the ON-OFF enabling signal Enable_ON-OFF to the driving module and the PWM module.

4. The method for improving the CCM conversion efficiency of the flyback resonant switching power supply according to claim 1, wherein the PWM module comprises three counters Counter2, counter3, counter4 and a time counting unit, the counter Counter2 is configured to count the number of zero points of the primary currents when State=1, i.e., the MOS transistor is switched on in the ON-OFF state, and the input signals of the Counter2 are the state signal State, the ON-OFF enabling signal Enable_ON-OFF, the duty ratio signal Duty, and current detection module output signals VCOMP1 and VCOMP1', and the output signal is a MOS transistor switch-off signal Flag_off, in the case of State=1 and Enable_ON-OFF=1, when Duty=1, VCOMP1⊕COMP1'=1, the counter Counter2 starts counting; when Duty=0, the counter Counter2 is cleared, and when the counter Counter2=2 the MOS transistor switch-off signal Flag_off is outputted; the counter Counter3 is configured to count the conducting time of the MOS transistor in the soft-start state (State=0) and the zero points of the primary current when the MOS transistor is switched off in State=1, i.e., the ON-OFF state; the input signals of the Counter3 are the state signal State, the ON-OFF enabling signal Enable_ON-OFF, the duty ratio signal Duty, and signals VCOMP1 and VCOMP1' outputted by the current detection module output, and the output signal is the MOS transistor switch-on signal Flag_on; when Duty=0, VCOMP1⊕COMP1'=1, the counter Counter3 starts counting; when Duty=1, the counter Counter3 is cleared, and the MOS transistor switch-on signal Flag_on can be outputted when the counter3 count reaches a requirement; the counter Counter4 is configured to control the conducting time of the MOS transistor in the State=0, that is, the soft-start state, and the switch-off of the MOS transistor when the primary current in the State=1, that is the ON-OFF state, is constantly greater than zero in the MOS transistor conducting phase, that is, the MOS transistor switch-off when the time length Ttap=0, the input signals of the counter Counter4 are the duty ratio signal Duty, and the output of the counter Counter4 is the MOS transistor switch-off signal Flag_off; when Duty=1, the counter Counter4 starts counting; when Duty=0, the counter Counter4 is cleared; the time counting unit is configured to count the time length Ttap of the counter Counter2>=1 and the counter Counter2<=2 in the State=1 i.e., ON-OFF state, so the input signals of the time counting unit is counter2 and the state signal State, and the output signal is the time length Ttap, in short, the counters Counter4 and Counter3 are configured to control the MOS transistor conducting time and the MOS transistor off-time in the State=0 state, respectively; in the State=1 state, when the ON-OFF enabling signal Enable_ON-OFF=1, the MOS transistor conducting time is jointly controlled by the counter2 and the counter4, the MOS transistor off-time is controlled by the counter3, and the time counting unit is also operated in the State=1 state;

when the operation state signal State=0, i.e., the system is in the soft-start state, the system gives a conducting time Tonmax, in which case the primary MOS transistor conducting time is Tonmax in one switch cycle, and when the counter Counter4 counts to the system given conducting time Tonmax, the MOS transistor switch-off signal Flag_off is set to 1 and inputted to the driving module; when the counter Counter3 counts to 4, that is, the fourth zero point of the primary current after the primary MOS transistor is switched off, according to the relationship between the capacitance voltage and the current, it corresponds to a second valley of the drain-source voltage Vds in resonance after the primary MOS transistor is switched off, that is, if the MOS transistor is switched on at this time, the switching loss is minimized, and the MOS transistor switch-on signal Flag_on is set to 1 and inputted to the driving module;

when the operation state signal State=1, that is, the system is in the ON-OFF state, when the ON-OFF enabling signal Enable_ON-OFF=1, the counter Counter2=2 or Enable_ON-OFF=1, the counter Counter2=0, and the counter4 counts to the system given conducting time Tonmax, the MOS transistor switch-off signal Flag_off is set to 1, and the time length Ttap is calculated by the time calculation unit when the counter Counter2>=1 and the counter Counter2<=2, when Ttap is large, a negative current of the primary current at the conducting phase of the MOS transistor is large, and a time of the negative current is long, and an energy returned to the power supply is large, an energy transmitted to the secondary winding is small, and an overall efficiency of the system is low, therefore, when the Ttap is small or the primary current is just greater than zero when the MOS transistor is switched on, this is the best operation point, when the system operation point is close to the best operation point, the overall efficiency of the system is high; based on the above theory, the system sets a threshold value Tset for Ttap, when Ttap>Tset, the current operation point is far away from the optimal operation point, the current operation cycle switch on the MOS transistor at a first valley when the drain source voltage Vds resonates after the primary MOS transistor is switched off, that is, the MOS transistor is ensured to be switched on at the valley while the MOS transistor switch-off time is reduced, with the switch-off time of the MOS transistor reduced, the secondary current is reduced less, the primary current of the corresponding next operation cycle is pulled up, and the Ttap decreases accordingly, so that the system operation point of the next operation cycle is close to the optimal operation point, that is, when the ON-OFF enabling signal Enable_ON-OFF=1 and the counter Counter3=2, the MOS transistor switch-on signal Flag_on is set to 1; when Ttap=0, the primary current of the current operation cycle is always greater than zero in the conducting phase of the MOS transistor, that is, there is no zero point, the MOS transistor is switched on at the second valley when the drain-source voltage Vds resonates after the primary MOS transistor is switched off, and the primary current in the next operation cycle is pulled down as a whole, so that the operation point of the system of the next operation cycle is close to the optimal operation point, that is, when the ON-OFF enabling signal Enable_ON-OFF=1 and the counter Counter3=4, the MOS transistor switch-on signal Flag_on is set to 1; when 0<Ttap<=Tset, the operation point of the current operation cycle system is ideal and approaching the optimal operation point, the operation state from the previous cycle is maintained, that is, when the ON-OFF enabling signal Enable_ON-OFF=1, the counter Counter3=N, N corresponds to the operation state of the previous operation cycle, and when in the previous operation cycle the MOS transistor is switched on at the second valley when the drain-source voltage Vds resonates after the MOS transistor is switched off, then N=4; when in the previous operation cycle the MOS transistor is switched on at the first valley when the drain-source voltage Vds resonates after the MOS transistor is switched off, then N=2, and the MOS transistor switch-on signal Flag_on is set to 1; the PWM module outputs the MOS transistor switch-off signal Flag_off and the MOS transistor switch-on signal Flag_on to the driving module to realize a control of the switch transistor duty ratio signal Duty.

5. The method for improving the CCM conversion efficiency of the flyback resonant switching power supply according to claim 1, wherein the driving module comprises a SR latch Latch2, two inverters inverter1 and inverter2, and two AND gates and2 and and3, wherein a S end of the SR latch Latch2 is connected to a MOS transistor switch-on signal Flag_on, a R end is connected to a MOS transistor switch-off signal Flag_off, an output end Q end of the SR latch Latch2 is connected to an input end of the AND gate and2, a state control signal State is connected to an input end of the AND gate and3, a ON-OFF enabling signal Enable_ON-OFF is connected to the other input end of the AND gate and3 via the inverter inverter1, an output of the AND gate and3 is connected to the other input end of the AND gate and2 via the inverter inverter2, and the AND gate and2 outputs a switch control signal Duty;

when the operation state signal equals 0, i.e.,State=0, the driving module sets the switch transistor duty ratio signal Duty to 1 when the MOS transistor switch-on signal Flag_on=1, that is, the primary MOS transistor is switched on, and the switch transistor duty ratio signal Duty is set to 0 when the MOS transistor switch-off signal Flag_off=1, that is, the primary MOS transistor is switched off; when the operation state signal State=1 and ON-OFF enabling signals Enable_ON-OFF=0, the circuit is in an OFF state, and the driving module sets the switch transistor duty ratio signal Duty to 0; when the operation state signal State=1 and the ON-OFF enabling signal Enable_ON-OFF=1, the system is in an ON state, and the driving module sets the switch transistor duty ratio signal Duty to 1 when the MOS transistor switch-on signal Flag_on=1, that is, the primary MOS transistor is switched on, and sets the switch transistor duty ratio signal Duty to 0 when the MOS transistor switch-off signal Flag_off=1, that is, the primary MOS transistor is switched off; the above process is repeated to cyclically control the switching on and off of the switching power supply power transistor so as to make the system more stable and to obtain higher operation efficiency.

6. A control method for a resonant switching power supply, comprising:
sampling: sampling and processing a primary resistance voltage of the switching power supply to generate a first signal;
state detection: acquiring the first signal and a switch control signal and determining an operation state of the switching power supply, the operation state being a soft-start state or a ON-OFF state;
switch control: presetting a threshold value Tset, when the operation state is the ON-OFF state, performing:
a first switch-off control: acquiring the first signal and the switch control signal, calculating a time interval Ttap between zero points of adjacent primary currents of the switching power supply during a present conducting time, and outputting a first control signal at the zero points and the first control signal being a switch-off signal;
a first switch-on control: comparing the time interval Ttap with the preset threshold value Tset, when Ttap>Tset, controlling the present switch-off time to be less than a switch-off time of a previous cycle, outputting the first control signal and the first control signal being a switch-on signal, when Ttap=0, controlling the present switch-off time to be greater than a switch-off time of the previous cycle, outputting the first control signal and the first control signal being the switch-on signal, when 0<Ttap<=Tset, controlling the present switch-off time to be the same as the switch-off time of the previous switch cycle, outputting the first control signal and the first control signal being a switch-on signal; and
drive output: generating the switch control signal according to the first control signal, wherein when the first control signal is a switch-on signal, the switch control signal is a switch-on signal, and when the first control signal is a switch-off signal, the switch control signal is a switch-off signal.

7. The control method according to claim 6, wherein the switch control further comprises a preset conducting time, wherein:
the first switch-off control specifically comprises acquiring the first signal and the switch control signal, calculating the number of counter2 of zero points of the primary current of the switching power supply in a present conducting time, and calculating the time interval Ttap between adjacent zero points, when counter2=2 or counter2=0 and the conducting time reaches the preset conducting time, outputting the first control signal and the first control signal being a switch-off signal; and
the first switch-on control specifically comprises acquiring the first signal and the switch control signal, calculating the number counter3 of zero points of the primary current of the switching power supply in the present switch-off time, and comparing the time interval Ttap with the preset threshold value Tset; when Ttap>Tset, outputting the first control signal and the first control signal being a switch-on signal when counter3=2; when Ttap=0, outputting the first control signal and the first control signal being a switch-on signal when counter3=4; when 0<Ttap<=Tset, outputting the first control signal and the first control signal being a switch-on signal when counter3=N, wherein N is a value of counter3 in a previous switch cycle; and repeatedly performing the first switch-off control.

8. The control method according to claim 6, further comprising:
ripple adjustment: presetting output voltage upper limit Vmax and output voltage lower limit Vmin, acquiring an output voltage Vo of the switching power supply, comparing the output voltage Vo, the output voltage upper limit Vmax, and the output voltage lower limit Vmin when the operation state is the ON-OFF state, and outputting a second control signal, wherein when Vo>Vmax, the second control signal is a switch-off signal, and when Vo<Vmin, the second control signal is a switch-on signal;

the step of switch control further comprising acquiring the second control signal, and performing the first switch-off control when the second control signal is the switch-on signal;

the step of drive output specifically comprising generating the switch control signal according to the first control signal, the second control signal, and the operation state, wherein when the operation state is the ON-OFF state, when the first control signal and the second control signal are both the switch-on signals, the switch control signal is the switch-on signal, and when the first control signal is the switch-off signal or the second control signal is the switch-off signal, the switch control signal is the switch-off signal.

9. The control method according to claim 6, wherein the step of sampling and processing a primary resistance voltage of the switching power supply comprises:

providing a comparator COMP1 and a D flip-flop D1, a positive input end of the COMP1 being connected to the primary resistance voltage, a negative input end of the COMP1 being connected to ground, an output end of the COMP1 outputting a signal VCOMP1, and an output end of the COMP1 being connected to an input end of the D flip-flop D1, and an output of the D flip-flop D1 outputting a signal VCOMP1', the first signal comprising the signal VCOMP1 and the signal VCOMP1'.

10. The control method according to claim 9, wherein the step of determining the operation state of the switching power supply specifically comprises determining, based on the first signal and the switch control signal, whether zero points exist during a conducting time of each of n consecutive switch cycles for the switching power supply, when zero points exist for each of during a conducting time of each of n consecutive switch cycles for the switching power supply, the operation state is the ON-OFF state; when zero points do not exist during a conducting time of each of n consecutive switch cycles for the switching power supply, the operation state is the soft-start state, where 5≤n≤20.

11. The control method according to claim 10, wherein the switching power supply comprises a MOS transistor, and the switching power supply is controlled to be switched on and off by controlling the switching on and off of the MOS transistor, the switch-on signal is of high level, and the switch-off signal is of low level.

12. The control method according to claim 11, wherein the step of determining, based on the first signal and the switch control signal, whether zero points exist during a conducting time of each of n consecutive switch cycles for the switching power supply comprises:

performing a logic operation Duty*(COMP1⊕VCOMP1') within the conducting time of each of the n switch cycles, wherein Duty is the switch control signal, and when Duty*(COMP1⊕VCOMP1')=1 is within the conducting time of all then switch cycles, it is determined that zero points are within the conducting time of each of the consecutive n switch cycles for the switching power supply, and the operation state is the ON-OFF state; wherein the logic operator ⊕ indicates a logic relationship of exclusive OR.

13. The control method according to claim 12, wherein an operation state signal is outputted after the operation state is determined, the operation state signal is a level signal, the operation state signal indicates the ON-OFF state signal when the operation state signal is of high level, and the operation state signal indicates the soft-start state signal when the operation state signal is of low level.

14. The control method according to claim 6, wherein the switch control step further comprises:

when the operation state is the soft-start state, performing:

a second switch-off control: calculating the conducting time and, when the conducting time reaches the preset conducting time, outputting the first control signal and the first control signal being the switch-off signal; and a second switch-on control: acquiring the first signal and the switch control signal, calculating the number of zero points counter3 of the primary current of the switching power supply in the present switch-off time, and when counter3=4, outputting the first control signal and the first control signal being the switch-on signal;

the drive output further comprises:

when the operation state is the soft-start, the switch control signal is consistent with the first control signal.

15. A control system for a resonant switching power, comprising:

a current detection module configured to sample a primary sampling resistance voltage of a switching power supply and processing the primary sampling resistance voltage to output a first signal;

a state detection module connected to the current detection module to acquire the first signal, connected to a driving module to acquire a switch control signal, and configured to determine an operation state of the switching power supply to generate an operation state signal, wherein the operation state signal is a soft-start state signal or a ON-OFF state signal;

a PWM module connected to the current detection module to acquire the first signal, and connected to the state detection module to acquire the operation state signal, the PWM module being configured to acquire a preset conducting time and a threshold value Tset, and to perform a first switch-off control and a first switch-on control when the operation state signal is the ON-OFF state signal, wherein the first switch-off control comprises acquiring the first signal and the switch control signal, calculating a time interval Ttap between the zero points of adjacent primary currents of the switching power supply during a present conducting time, and outputting a first control signal at the zero points and the first control signal being the switch-off signal;

the first switch-on control comprises comparing the time interval Ttap with a preset threshold value Tset, when Ttap>Tset, controlling the present switch-off time to be less than the switch-off time of a previous cycle, outputting the first control signal and the first control signal being a switch-on signal, when Ttap=0, controlling the present switch-off time to be greater than the switch-off time of the previous cycle, outputting the first control signal and the first control signal being the switch-on signal, when 0<Ttap<=Tset, controlling the present switch-off time to be the same as the switch-off time of the previous switch cycle, outputting the first control signal and the first control signal being the switch-on signal; and the driving module connected to the PWM module to acquire the first control signal and generate the switch control signal, wherein when the first control signal is the switch-on signal, the switch control signal is the switch-on signal, and when the first control signal is the switch-off signal, the switch control signal is the switch-off signal.

16. The control system according to claim 15, further comprising:

an output feedback module connected to the state detection module to acquire the operation state signal, and to acquire an output voltage upper limit Vmax, an output voltage lower limit Vmin, and an output voltage Vo of the switching power supply; when the operation state signal being the ON-OFF state signal, comparing the output voltage Vo with the preset output voltage upper limit Vmax and the preset output voltage lower limit Vmin, and outputting a second control signal; when Vo>Vmax, the second control signal being the switch-off signal; when Vo<Vmin, the second control signal being the switch-on signal;

wherein the PWM module is further connected to the output feedback module to acquire the second control signal, and is configured to perform the first switch-off control when the second control signal is the switch-on signal;

wherein the driving module is further connected to the output feedback module to acquire the second control signal, and is connected to the state detection module to acquire the operation state signal to generate the switch control signal, wherein when the operation state signal is the ON-OFF state signal, when both the first control signal and the second control signal are switch-on signals, the switch control signal is the switch-on signal, when the first control signal is the switch-off signal or the second control signal is the switch-off signal, the switch control signal is the switch-off signal.

17. The control system according to claim 16, wherein the switching power supply comprises a MOS transistor, and the switching power supply is controlled to be switched on and off by controlling the switching on and off of the MOS transistor, the switching switch-on signal being of high level, and the switching switch-off signal being of low level.

18. The control system according to claim 17, wherein the PWM module comprises a comparator COMP2, a comparator COMP3, a SR latch Latch1, and an AND gate and1, wherein a negative input end of the comparator COMP2 is connected to the preset output voltage upper limit Vmax, a positive input end of the comparator COMP2 and a negative input end of the comparator COMP3 are connected to the output voltage Vo, a positive input end of the comparator COMP3 is connected to the output voltage lower limit Vmin, an output end of the comparator COMP2 is connected to a R input end of the SR latch Latch1, an output end of the comparator COMP3 is connected to a S input end of the SR latch Latch1, an output end of the SR latch Latch1 and the operation state signal are connected to an input end of the AND gate and1, an output end of the AND gate and1 outputs the second control signal, and the second control signal is an enabling signal.

19. The control system according to claim 18, wherein the driving module comprises a SR latch Latch2, an AND gate and2, an AND gate and3, an inverter inverter1, and an inverter inverter2, wherein a S input end of the SR latch Latch2 is connected to the first control signal, the first control signal is inputted to a R input of the SR latch Latch2 after being inverted, an output end of the SR latch Latch2 is connected to an input end of the AND gate and2, an input end of the inverter inverter1 is connected to the enabling signal, an input end of the AND gate and3 is connected to the operation state signal and is connected to an output end of the inverter inverter1, and the inverter inverter2 is connected between the input end of the AND gate and2 and the output end of the AND gate and3.

20. The control system according to claim 15, wherein the current detection module comprises a comparator COMP1 and a D flip-flop D1, a positive input end of the comparator COMP1 is connected to the primary resistance voltage, a negative input end of the comparator COMP1 is connected to ground, an output end of the comparator COMP1 outputs signal VCOMP1, and an output end of the comparator COMP1 is connected to an input end of the D flip-flop D1, and an output end of the D flip-flop D1 outputs signal VCOMP1', the first signal comprises the signal VCOMP1 and the signal VCOMP1'.

* * * * *